(12) United States Patent
Tajimi

(10) Patent No.: US 8,502,379 B2
(45) Date of Patent: Aug. 6, 2013

(54) METHOD FOR MANUFACTURING SEMICONDUCTOR DEVICE, AND SEMICONDUCTOR DEVICE

(75) Inventor: Shigehisa Tajimi, Shonai-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/331,654

(22) Filed: Dec. 20, 2011

(65) Prior Publication Data
US 2012/0086121 A1 Apr. 12, 2012

Related U.S. Application Data

(62) Division of application No. 12/028,325, filed on Feb. 8, 2008, now Pat. No. 8,101,462.

(30) Foreign Application Priority Data
Feb. 14, 2007 (JP) ................................ 2007-033237

(51) Int. Cl.
*H01L 23/48* (2006.01)
(52) U.S. Cl.
USPC .................... 257/737; 257/E23.021; 257/784

(58) Field of Classification Search
USPC ........... 257/737–738, 778–784, 786, E23.021
See application file for complete search history.

(56) References Cited

U.S. PATENT DOCUMENTS

| 7,420,284 B2 * | 9/2008 | Miyazaki et al. ............. 257/781 |
| 2002/0168797 A1 | 11/2002 | DiStefano et al. |
| 2006/0186540 A1 * | 8/2006 | Buchwalter et al. .......... 257/737 |
| 2007/0023924 A1 * | 2/2007 | Funaki .......................... 257/778 |

FOREIGN PATENT DOCUMENTS

| JP | A 2000-269249 | 9/2000 |
| JP | A 2003-249592 | 9/2003 |
| JP | A 2004-235322 | 8/2004 |

* cited by examiner

*Primary Examiner* — Hoa B Trinh
(74) *Attorney, Agent, or Firm* — Oliff & Berridge, PLC

(57) ABSTRACT

A semiconductor device includes an insulating film base member and a wiring pattern that is formed on the insulating film base member. The wiring pattern has a surface, with at least a peripheral section of the surface being a peeled surface of the wiring pattern peeled from the insulating film base member. The semiconductor device further includes a plating layer that covers the surface of the wiring pattern, and an IC chip that has an active surface with a bump bonded to the wiring pattern. The peeled surface of the wiring pattern is peeled from the insulating film base member around a bonding position of the wiring pattern bonded with the bump.

3 Claims, 4 Drawing Sheets

- Temperature
- Pressure Bonding Load
- Time

Peeled Surface

METHOD FOR MANUFACTURING SEMICONDUCTOR DEVICE, AND SEMICONDUCTOR DEVICE

This application is a divisional of U.S. application Ser. No. 12/028,325, now issued as U.S. Pat. No. 8,101,462, filed on Feb. 8, 2008, which claims priority to Japanese Patent Application No. 2007-033237, filed Feb. 14, 2007, the entire disclosures of which are hereby incorporated by reference herein.

BACKGROUND

1. Technical Field

The invention relates to methods for manufacturing semiconductor devices, and semiconductor devices.

2. Related Art

In electrical products that have been considerably reduced in size and weight in recent years, such as liquid crystal panels and portable mobile terminals, IC chips stored inside their housings may generally be mounted on a wiring substrate in a film shape that can be readily bent by hand, for example. The wiring substrate may be formed from an insulating film base member, and wiring patterns formed on the base member, and is called a tape carrier or a flexible substrate. Also, products with IC chips mounted on a film-like wiring substrate are called tape carrier packages (TCP), chip on films (COF) and the like. Japanese Laid-open Patent Applications JP-A-2003-249592, JP-A-2004-235322, and JP-A-2000-269249 are examples of related art.

For example, in the step of connecting (in other words, bonding) bumps of an IC chip onto inner leads, high temperature and high pressure may also be applied to the film that is the base of the inner leads, such that tip portions of the inner leads may be peeled off the film, as described in paragraph [0008] with reference to FIG. 6B of the aforementioned Japanese Laid-open Patent Application JP-A-2003-249592.

The inner leads may be formed through, for example, forming a copper foil on the film, patterning the foil, and plating zinc (Sn) on the surface of the foil. If the tip portions of the inner leads are peeled off the film, copper may be exposed in the peeled surface of the tip portions. If a voltage is applied to the inner leads in this state, electromigration may occur at the peeled surface, and the copper may grow in unintended directions.

For example, when a negative bias voltage (−) is applied to the inner lead where copper is exposed at the peeled surface of the tip portion, as shown in FIG. 5, a reaction ($Cu^{2+}+2e^- \rightarrow Cu$) progresses at the peeled surface. Also, when a positive bias voltage (+) is applied to the inner lead where copper is exposed at the peeled surface of the tip portion, a reaction ($Cu \rightarrow Cu^{2+}+2e^-$) progresses at the peeled surface. When the electromigration progresses in this manner, copper that is a wiring member grows at the tip portion of the inner lead, as indicated by a broken line in FIG. 5. Then, the grown copper may form bridges to and become short-circuited with adjacent inner leads.

Also, circuit forming surfaces (i.e., active surfaces) including the bumps of the IC chip, and bonded surfaces between the bumps and the inner leads are generally sealed with resin or the like, but moisture would likely be condensed between the resin and the film. If moisture adheres to the exposed surface (i.e., peeled surface) of the copper, ionization of copper and diffusion of $Cu^{2+}$ would more readily occur, such that the electromigration is further accelerated.

SUMMARY

According to an advantage of some aspects of the invention, it is possible to provide a method for manufacturing a semiconductor device by which generation of electromigration at wiring patterns can be suppressed. Also, a semiconductor device that can suppress generation of electromigration at its wiring patterns can be provided.

A method for manufacturing a semiconductor device in accordance with a first embodiment of the invention includes, when bonding bumps of an IC chip to a bonding position of a wiring pattern that is formed on an insulating film base member and has a surface covered by a plating layer, forming a plating layer around the bonding position among the wiring pattern at least in an outer peripheral section of a peeled surface of a portion of the wiring pattern peeled from the film base member.

It is noted that the "insulating film base member" may be an organic insulating film composed of, for example, polyimide or the like, the "plating layer" may be, for example, a zinc (Sn) plating layer, and the "wiring pattern" may be an inner lead that is formed from a patterned copper foil. Also, the wiring pattern and the bump of the IC chip may be bonded by, for example, thermocompression bonding using a bonding tool.

A method for manufacturing a semiconductor device in accordance with a second embodiment of the invention includes, when bonding bumps of an IC chip to a bonding position of a wiring pattern that is formed on an insulating film base member and has a surface covered by a plating layer, melting the plating layer by heat at the bonding, thereby flowing the melted plating from the surface of the wiring pattern to an area around the bonding position among the wiring pattern at least in an outer peripheral section of a peeled surface of a portion of the wiring pattern peeled from the film base member.

A method for manufacturing a semiconductor device in accordance with a third embodiment of the invention includes, when bonding bumps of an IC chip to a bonding position of a wiring pattern that is formed on an insulating film base member and has a surface covered by a plating layer, peeling a portion of the wiring pattern around the bonding position from the film base member, and melting the plating layer by heat at the bonding, thereby flowing the melted plating from the surface of the wiring pattern to at least an outer peripheral section of a peeled surface of the portion of the wiring pattern peeled from the film base member.

In accordance with a fourth embodiment of the invention, in the method for manufacturing a semiconductor device according to any one of the first through third embodiment of the invention, the portion may be a tip portion of the wiring pattern.

By the methods for manufacturing a semiconductor device according to the first through fourth embodiments, the peeled surface at least in the peripheral section thereof is protected by the plating layer formed thereon, and occurrence of electromigration at the protected peripheral section can be suppressed. By this, the growth of the wiring member on the peeled surface can be suppressed at least in its peripheral section, and unintended short-circuits among the wiring patterns can be prevented.

In accordance with a fifth embodiment of the invention, in the method for manufacturing a semiconductor device according to any one of the first through fourth embodiment of the invention, the step of flowing the melted plating may include flowing the melted plating over the entire surface of the peeled surface. By this method, the plating layer can be formed on the entire surface of the peeled surface, and electromigration can be suppressed over the entire surface of the peeled surface.

In accordance with a sixth embodiment of the invention, in the method for manufacturing a semiconductor device according to any one of the first through fifth embodiment of the invention, the tip portion of the wiring pattern may have a line width smaller than a line width of other portions of the wiring pattern.

According to this method, the area of the peeled surface can be made smaller. Also, for example, when the plating layer is formed on the surface of the wiring pattern by an electrolytic plating method, a narrower line width causes greater current concentration at the tip portion, such that a thicker plating layer can be formed on the surface of the tip portion compared to the other portions. Accordingly, the plating layer can be more readily formed over the entire peeled surface.

A semiconductor device in accordance with a seventh embodiment of the invention is equipped with an insulating film base member, a wiring pattern that is formed on the film base member and has a surface covered by a plating layer, and an IC chip that has an active surface with bumps bonded to the wiring pattern, wherein the plating layer covers the surface of the wiring pattern and at least a peripheral section of a peeled surface of the wiring pattern peeled from the film base member around a bonding position of the wiring pattern bonded with the bump. It is noted that the "active surface" is a surface of the IC chip on which IC circuits are formed.

According to the structure described above, at least in the peripheral section of the peeled surface, generation of electromigration can be controlled, and therefore growth of the wiring member can be suppressed, such that the reliability of the semiconductor device can be improved.

DESCRIPTION OF EXEMPLARY EMBODIMENTS

Figure 1:
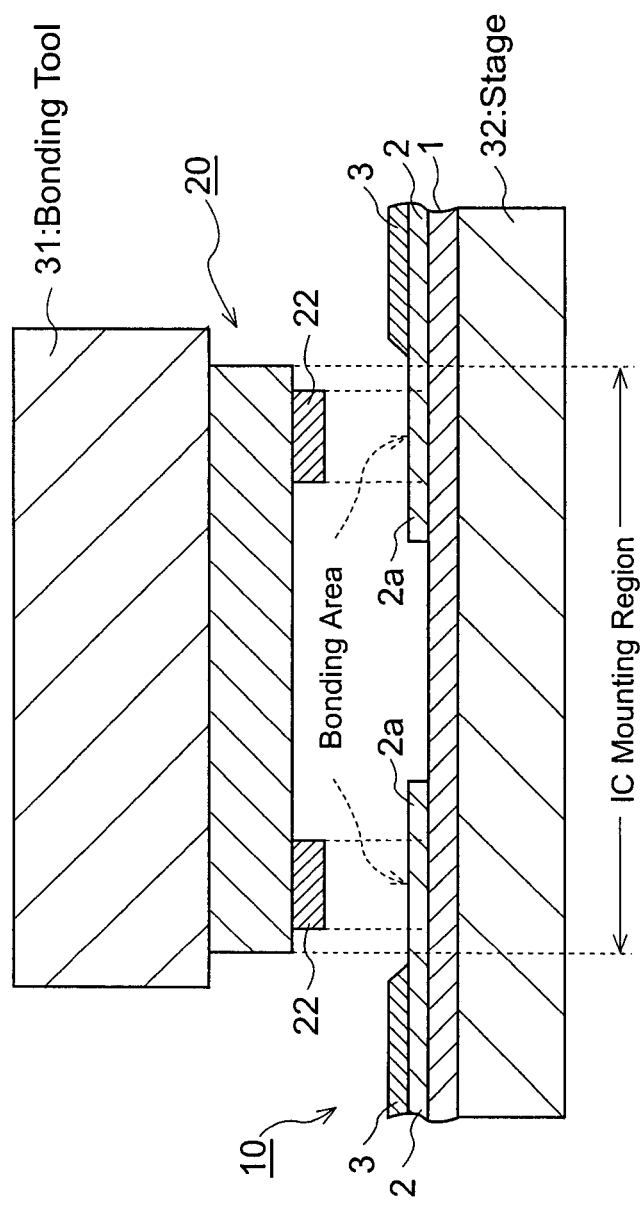
FIG. 1 is a schematic cross-sectional view showing a method for manufacturing a semiconductor device in accordance with an embodiment of the invention.
Figure 2A:
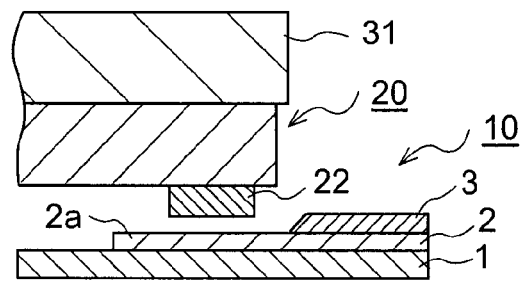
FIGS. 2A to 2C are cross-sectional views in enlargement showing a process of bonding a bump 22 and an inner lead 2.
Figure 2B:
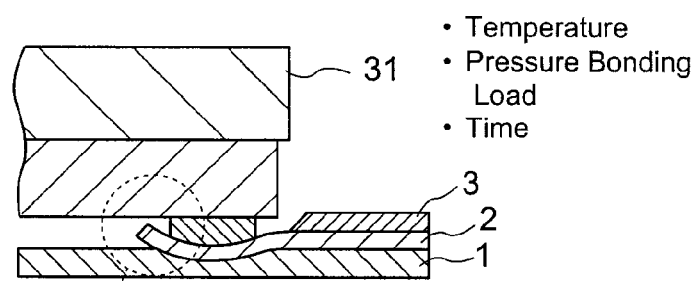
Figure 2C:
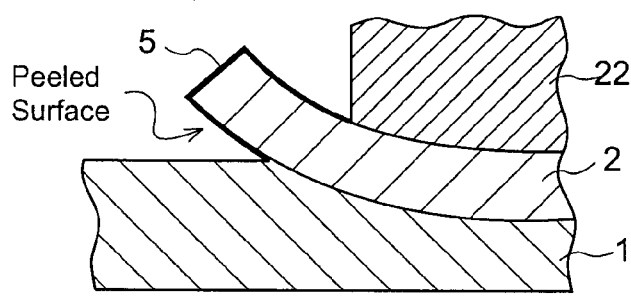

Preferred embodiments of the invention are described below with reference to the accompanying drawings. FIG. 1 is a schematic cross-sectional view showing a method for manufacturing a semiconductor device in accordance with an embodiment of the invention. FIGS. 2A to 2C are cross-sectional views in enlargement showing a process of bonding a bump 22 and an inner lead 2

As shown in FIG. 1, the flexible substrate 10 has an insulating film 1 composed of, for example, polyimide or the like, and a plurality of inner leads 2 and outer leads (not shown) connecting to the inner leads formed on the film 1. The inner leads 2 and the outer leads may be formed through, for example, forming a copper foil on the film 1, patterning the copper foil using photolithography and etching techniques, and then applying a plating treatment on its surfaces (more specifically, the upper surface and side surface). Although not illustrated, the surfaces of the inner leads 2 and the outer leads are plated. The plating may be, for example, Sn plating. Also, the plating may be formed by an electrolytic plating method or an electroless plating method.

Further, an IC mounting region is prepared on the film 1. A bonding region (or a bonding area) for the inner leads 2 and the bumps 2 is disposed inside the IC mounting region, and tip sections 2a of the inner leads 2 are disposed further inside in the IC mounting region than the bonding area. Also, solder resist 3 is formed on the film 1 outside of the IC mounting region, and the inner leads 2 are covered by the solder resist 3. On the other hand, an IC chip 20, a so-called bear chip, has an active surface (i.e., a circuit forming surface), and a plurality of bumps 22 composed of Au, Sn or the like are formed on the active surface.

When this IC chip 20 is face-down mounted on the flexible substrate 10, first, as shown in FIG. 1, the back surface side of the IC chip 20 is supported by a bonding tool 31, and the flexible substrate 10 is disposed on a stage 32 of a bonding apparatus. Then, the IC chip 20 and the flexible substrate 10 are positioned for mutual alignment while the active surface of the IC chip 20 is faced toward the flexible substrate 10. By this positional alignment, the bumps 22 of the IC chip 20 are positioned immediately above the bonding area.

Next, as shown in FIG. 2A, for example, the bonding tool 31 is lowered, thereby moving the IC chip 20 closer to the flexible substrate 10, and the bumps 22 and the inner leads 2 are heated. Then, as shown in FIG. 2B, the active surface side of the IC chip 20 is forcefully pressed against the flexible substrate 10 by a pushing operation of the bonding tool 31, whereby the inner leads 2 and the bumps 22 are connected together by solid-state welding and eutectic bonding (in other words, bonded together).

In the present embodiment, the process condition for the bonding process is adjusted such that the tip sections 2a of the inner leads 2 are peeled from the film 1, and the plating layer covering the surface (i.e., the upper surface and the side surface) of the tip sections 2a is melted by the heat of the bonding tool 31 thereby flowing and spreading the melted plating over the entire peeled surface (i.e., the lower surface) of the tip sections 2a where the copper is exposed. By flowing and spreading the melted plating, the plating layer is formed over the entire peeled surface of the tip sections 2a to cover the peeled surface. As the condition for the bonding process, the higher the temperature of the bonding tool 31, the greater the pressing force (i.e., the load) to push the bonding tool 31 to the flexible substrate 10, and the longer the application time to apply the load by the bonding tool 31, the easier the flowing and spreading of the plating layer to the peeled surface becomes.

According to experiments conducted by the inventors, when the temperature of the bonding tool 31 was 455° C., the pressing force (i.e., the load) to push the bonding tool 31 to the flexible substrate 10 was 17 mgf/um2, the Sn plating started flowing and spreading to the tip section 2a. In this respect, as a more concrete example of the invention, the temperature of the bonding tool 31 may be set at 455° C. or higher, the pressing force to push the bonding tool 31 to the flexible substrate 10 may be set at 17 mgf/um2, or higher. As a result, as shown in FIG. 2C, the plating layer 5 can be made to flow and spread to the peeled surface of the tip sections 2a.

However, the concrete example of the process condition described above is not an absolute reference, and the temperature, load and time to flow and spread the plating layer differ depending on the material and thickness of the plating layer, the line width and thickness of the inner lead, the apparatus to be used for the bonding process and the like. Although higher temperature, greater load and longer time duration would make it easier for the plating layer to flow and spread, as described above, there is a possibility that unacceptable defects such as breakdown of the semiconductor device may occur if these conditions are set to an excessive value. Therefore, when the invention is applied to the actual manufacturing process, optimal conditions may be searched for each product type of semiconductor devices, and each type and model of the bonding apparatus by conducting experiments on them, and the bonding process may preferably be conducted under the condition searched.

According to the semiconductor device in accordance with the embodiment of the invention, when the bumps 22 of the IC chip 20 are bonded to the bonding area of the inner leads 2, the plating layer 5 can be formed over the entire peeled surface of the tip sections 2a of the inner leads 2. By this, the peeled surface of the tip sections 2a can be protected, and occurrence of electromigration at the peeled surface can be suppressed. Accordingly, growth of copper (Cu) in the peeled surface can be suppressed, and short-circuit between adjacent ones of the inner leads by Cu bridges can be prevented. In the present embodiment, the film 1 corresponds to an "insulating film base member" of the invention, and the inner lead 2 corresponds to a "wiring pattern" of the invention.

Figure 3:
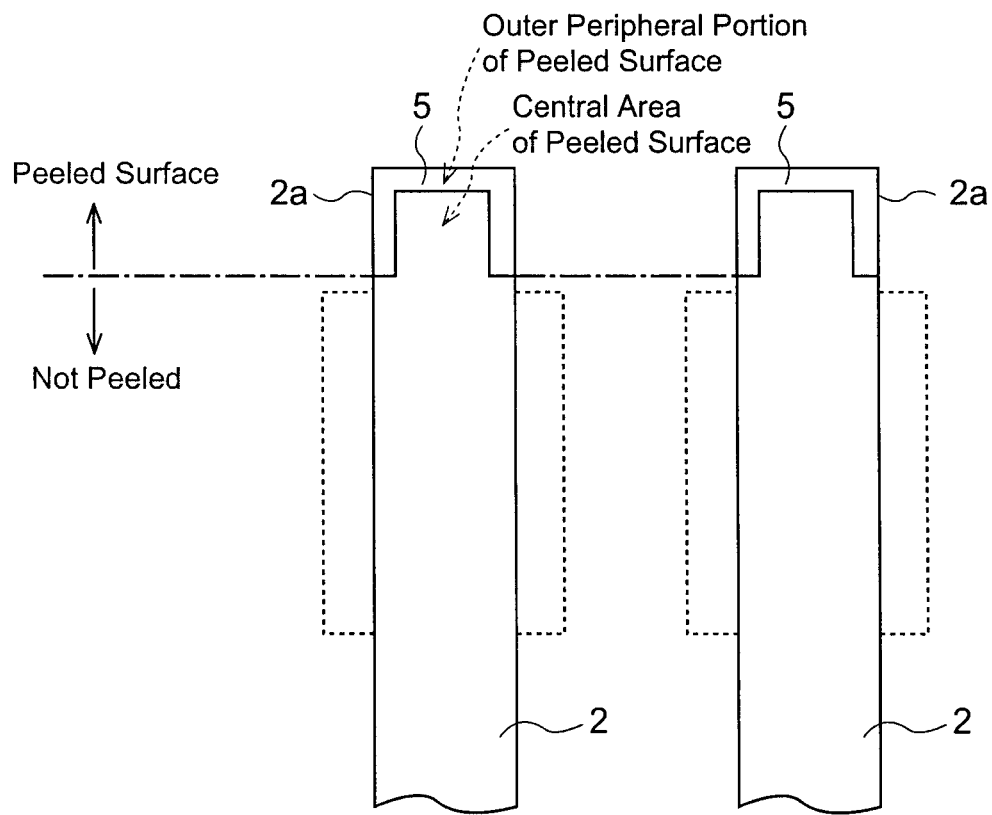
FIG. 3 is a figure showing an example of a plating layer 5 formed in a peeled surface.

It is noted that the embodiment is described above as to the case where the plating is made to flow and spread over the entire peeled surface of the tip section 2a, and the plating layer 5 is formed over the entire peeled surface. However, according to the invention, the plating layer 5 does not necessarily require to be formed over the entire peeled surface. FIG. 3 shows an example of a plating layer 5 formed in the peeled surface, as viewed from the lower side of the inner leads 2 (in other words, viewed from the substrate side of the film 1) after bonding. As shown in FIG. 3, in accordance with an aspect of the invention, it may be sufficient if at least an outer peripheral portion of the peeled surface is covered by the plating layer 5. The plating layer 5 may not need to be formed in the central area of the peeled surface. With this structure, occurrence of electromigration at least at the outer peripheral portion of the peeled surface can be suppressed. As a result, the wiring material Cu can be controlled so as not to grow outwardly from the outer peripheral portion of the peeled surface, which contributes to preventing short-circuits between adjacent ones of the inner leads 2 by Cu bridging.

Figure 4:
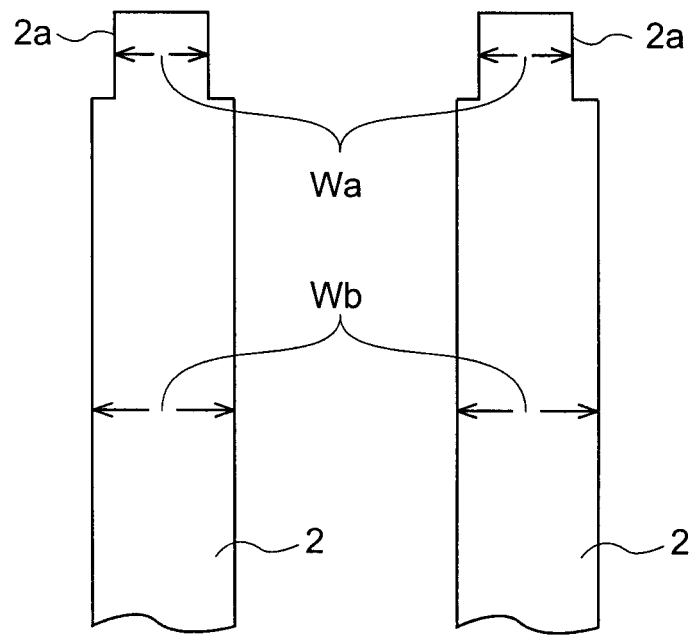
FIG. 4 is a figure showing an example of a plane configuration of inner leads 2.
Figure 5:
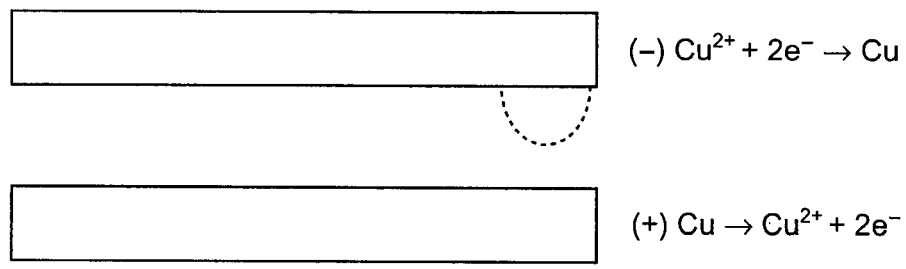
FIG. 5 is a figure for describing electromigration at an exposed surface of copper (Cu).

Also, in accordance with an aspect of the invention, the tip portion 2a of the inner lead 2 may be formed with a smaller line width compared to other portions. FIG. 4 shows an example of a plane configuration of the inner leads 2. When the line width Wa of the tip section 2a of the inner lead 2 is smaller than the line width Wb of other portions, a plating layer can be formed thicker at the tip section 2a than that of the other portion when the plating layer is formed on the surface of the inner lead 2 by an electrolyte plating method. This is because the current concentrates more when the line width is smaller. When the plating layer is formed thick at the tip section 2a, a greater amount of plating can be made to flow and spread from the surface of the tip section 2a to the peeled surface at the time of die-bonding. Also, in this case, the area of the peeled surface becomes smaller in proportion to the line width. Accordingly, it becomes easier to form the plating layer over the entire surface of the peeled surface to cover the peeled surface.

What is claimed is:

1. A semiconductor device comprising:
an insulating film base member;
a wiring pattern that is formed on the insulating film base member, the wiring pattern having a surface, at least a peripheral section of the surface being a peeled surface of the wiring pattern peeled from the insulating film base member;
a plating layer that covers the surface of the wiring pattern; and
an IC chip that has an active surface with a bump bonded to the wiring pattern, wherein
the peeled surface of the wiring pattern is peeled from the insulating film base member around a bonding position of the wiring pattern bonded with the bump, and
the wiring pattern includes an indentation portion formed around the bonding position, the indentation portion being adjacent to a portion of the wiring pattern that comprises the peeled surface.

2. The semiconductor device of claim 1, wherein:
at least part of the peeled surface is a tip section formed on the insulating film base member, wherein the plating layer is formed over at least an outer peripheral portion of the tip section.

3. The semiconductor device of claim 2, wherein:
the tip section of the wiring pattern is formed with a line width Wa that is smaller than a line width Wb of an other portion on the wiring pattern, and
the plating layer is relatively thicker at the tip section than that of the other portion.

* * * * *